USOO9348327B2

(12) United States Patent
Mizuochi et al.

(10) Patent No.: US 9,348,327 B2
(45) Date of Patent: May 24, 2016

(54) WORK MACHINE

(75) Inventors: Mariko Mizuochi, Hitachinaka (JP); Akinori Ishii, Ushiku (JP); Jinichi Yamaguchi, Hino (JP)

(73) Assignee: HITACHI CONSTRUCTION MACHINERY CO., LTD., Tokyo (JP)

( * ) Notice: Subject to any disclaimer, the term of this patent is extended or adjusted under 35 U.S.C. 154(b) by 401 days.

(21) Appl. No.: 14/124,787

(22) PCT Filed: Jun. 6, 2012

(86) PCT No.: PCT/JP2012/064566
§ 371 (c)(1),
(2), (4) Date: Dec. 9, 2013

(87) PCT Pub. No.: WO2012/169531
PCT Pub. Date: Dec. 13, 2012

(65) Prior Publication Data
US 2014/0121840 A1 May 1, 2014

(30) Foreign Application Priority Data

Jun. 10, 2011 (JP) .................. 2011-130552

(51) Int. Cl.
*G05B 15/02* (2006.01)
*G05B 17/02* (2006.01)
(Continued)

(52) U.S. Cl.
CPC ................ *G05B 15/02* (2013.01); *B60P 1/045* (2013.01); *E02F 9/265* (2013.01); *G05B 13/047* (2013.01); *G05B 13/048* (2013.01); *G05B 17/02* (2013.01);
(Continued)

(58) Field of Classification Search
CPC .... G05B 15/02; G05B 13/047; G05B 13/048; G05B 17/02; E02F 9/265; B60P 1/045; B60Y 2200/412; G06F 17/5018; G06F 17/5086; G06F 17/5095
See application file for complete search history.

(56) References Cited

U.S. PATENT DOCUMENTS

| 4,268,214 A | * | 5/1981 | Zeldman | .................. E02F 3/30 |
| | | | | 414/694 |
| 4,332,517 A | * | 6/1982 | Igarashi | .................. E02F 3/437 |
| | | | | 172/4.5 |

(Continued)

FOREIGN PATENT DOCUMENTS

| JP | 5-319785 A | 12/1993 |
| JP | 7-180192 A | 7/1995 |

(Continued)

*Primary Examiner* — Russell Frejd
(74) *Attorney, Agent, or Firm* — Baker Botts L.L.P.

(57) ABSTRACT

To provide a work machine with high stability in which a dynamic balance can be evaluated easily while the influence of a sudden stop of an travel base, an upperstructure and a work front is taken into consideration.
A stabilization control calculation unit (60a) and a command value generating unit (60i) are provided in a control device (60) of the work machine. The stabilization control calculation unit (60a) uses a sudden stop model and position information of each movable portion of the travel base and a machine body including the work front (6) to predict a change of stability until reaching a complete stop when a control lever (50) in an operating state is instantaneously brought back to a stop command position, and calculates a motion limit needed to prevent destabilization from occurring at any time instant until reaching the stop. The command value generating unit (60i) corrects the command information to a drive actuator on the basis of the calculation result of the stabilization control calculation unit (60a).

6 Claims, 9 Drawing Sheets

(51) Int. Cl.
*G05B 13/04* (2006.01)
*E02F 9/26* (2006.01)
*B60P 1/04* (2006.01)
*G06F 17/50* (2006.01)

(52) U.S. Cl.
CPC ........ G06F 17/5018 (2013.01); G06F 17/5086 (2013.01); G06F 17/5095 (2013.01); *B60Y 2200/412* (2013.01)

(56) References Cited

U.S. PATENT DOCUMENTS

| | | | | |
|---|---|---|---|---|
| 4,869,337 | A * | 9/1989 | Wagner | B60N 2/143 180/330 |
| 5,701,691 | A * | 12/1997 | Watanabe | E02F 9/2033 172/4 |
| 6,052,644 | A * | 4/2000 | Murakami | B60K 1/0058 123/319 |
| 6,061,617 | A * | 5/2000 | Berger | A01B 63/10 700/18 |
| 6,098,322 | A * | 8/2000 | Tozawa | E02F 3/437 37/414 |
| 6,819,993 | B2 * | 11/2004 | Koch | E02F 3/435 37/348 |
| 2012/0232763 | A1 * | 9/2012 | Mizuochi | B66C 23/905 701/50 |
| 2013/0066527 | A1 * | 3/2013 | Mizuochi | B66C 23/905 701/50 |

FOREIGN PATENT DOCUMENTS

| | | |
|---|---|---|
| JP | 7-279202 A | 10/1995 |
| JP | 2871105 B2 | 1/1999 |

* cited by examiner

WORK MACHINE

TECHNICAL FIELD

The present invention relates to a work machine used for structure demolition works, waste disposal, scrap handling, road works, construction works, civil engineering works, etc.

BACKGROUND ART

As a work machine used for structure demolition works, waste disposal, scrap handling, road works, construction works, civil engineering works, etc., there has been known a work machine in which an upperstructure is attached swingably to an upper portion of an travel base travelling by a power system while a multi-joint work front is attached to the upperstructure swingably in an up/down direction and front members constituting the work front are driven by actuators respectively. As an example of such a work machine, there has been a demolition work machine which is based on a hydraulic excavator. The demolition work machine includes a boom one end of which is connected to an upperstructure, an arm one end of which is connected to a distal end of the boom swingably, and a work tool such as a grapple, a bucket, a breaker or a crusher, which is attached to a distal end of the arm, so that the demolition work machine can perform a desired work.

This kind of work machine performs work while changing its posture variously in a state in which the boom, the arm and the work tool constituting the work front are stuck out of the upperstructure. For this reason, the work machine may lose its balance when an excessive work load is applied to the work machine or when the work machine performs an improper operation such as a quick motion in a state in which an overload is applied to the work machine and the front is stretched. Accordingly, various tipping over prevention techniques have been heretofore proposed for this kind of work machine.

For example, Patent Literature 1 discloses a technique as follows. That is, angle sensors are provided in a boom and an arm of a work machine respectively. Detection signals of the respective angle sensors are inputted to a control device. The control device calculates the gravity center position of the work machine as a whole and the bearing capacity of stable supporting points of an travel base in the ground surface, based on the detection signals. The value of the bearing capacity in the stable supporting points based on a result of the calculation is displayed on a display device while a warning is issued when the bearing capacity in a rear stable supporting point is not higher than a limit value for ensuring safe work.

In addition, Patent Literature 2 discloses another technique as follows. That is, sensors for detecting the posture, the motion and the work load of a machine body are provided. A model expressing present and future mechanical behavior concerned with the posture of the work machine body is constructed based on detection values of the respective sensors and with reference to a database. Determination is made as to whether the machine body will tip over or not. When tipping is predicted, a work motion in execution is stopped. Further, a motion for avoiding the tipping is started so as to prevent the tipping. When the tipping is predicted, an operator is notified of the tipping.

Further, Patent Literature 3 discloses a further technique as follows. That is, provided are angle sensors for detecting a boom angle, an arm angle, a bucket angle of a work front and a swing angle of an upperstructure, and an inclination angle sensor for detecting an inclination of a vehicle body in a front/rear direction. A static tipping moment of a work machine is calculated from detection values of the angle sensors and the inclination angle sensor and the dimensions of a predetermined portion of the vehicle body. In addition, a dynamic tipping moment generated due to a centrifugal force of swing of the upperstructure is calculated from a swing angular velocity. Further, a dynamic tipping moment generated at a sudden stop of the upperstructure is calculated from a maximum angular acceleration of the swing. A value in which one or the larger one of these two dynamic tipping moments is added to the static tipping moment is used as an tipping determination condition. The swing angular velocity is controlled when the determination condition is established.

CITATION LIST

Patent Literature

Patent Literature 1: Japanese Patent No. 2871105
Patent Literature 2: JP-A-5-319785
Patent Literature 3: JP-A-7-180192

SUMMARY OF INVENTION

Technical Problem

The work machine such as the aforementioned demolition work machine drives the massive travel base, the massive upperstructure and the massive work front so as to perform work. Therefore, when an operator performs an operation to stop the drive of the travel base, the upperstructure or the work front in execution for some reason, large inertia acts on the work machine to give a great influence on the stability. Particularly, if the operator performs an operation to stop the drive of the travel base, the upperstructure or the work front in execution hastily when a warning for notification of the possibility of tipping is issued from a warning device mounted on the work machine, there is a fear that large inertia may be overlapped in an tipping direction to increase the possibility of tipping.

However, the technique disclosed in Patent Literature 1 has the configuration in which only static balance is evaluated. Thus, there is a problem that the stability cannot be accurately evaluated under an environment where inertia acts. In addition, the technique disclosed in Patent Literature 2 does not take the influence of a sudden stop into consideration. Thus, tipping caused by the sudden stop cannot be prevented. In addition, the technique disclosed in Patent Literature 2 has the configuration in which a model expressing present and future mechanical behavior concerned with the posture of the work machine body and with reference to the database is constructed to determine whether the machine body will overturn or not. For this reason, there is a problem that practical real-time processing is difficult due to complicated calculation processing. Further, the technique disclosed in Patent Literature 3 can deal with the occasion of a sudden stop of the upperstructure. However, the technique disclosed in Patent Literature 3 does not take into consideration the influence of inertia caused by a motion of any other member than the upperstructure and the influence of a sudden stop of a motion of the front. Thus, there is a problem that a motion which can be dealt with is limited to a swing motion. In addition, due to the configuration in which the larger one of the moment calculated from the maximum angular acceleration of the swing and the moment calculated from the swing angular velocity is selected, it is likely that the possibility of tipping may be overestimated in some conditions. Thus, the working efficiency may deteriorate due to an excessive limit on a motion.

The invention has been accomplished to solve such problems inherent in the background art. An object of the invention is to provide a work machine with high stability in which a dynamic balance can be evaluated easily while the influence of a sudden stop of an travel base, an upperstructure and a work front is taken into consideration.

Solution to Problem

In order to solve the foregoing problems, the present invention provides a work machine including an travel base, a work machine body attached on the travel base, a work front attached to the work machine body swingably in an up/down direction, and a control device for controlling drive of each of these portions, wherein: the control device includes: a stabilization control calculation unit which predicts a change in stability until each movable portion in the travel base, the work machine body and the work front stops in accordance with a change in an operating velocity of a control lever for operating the drive of the movable portion when the control lever in an operating state is brought back to a stop command position, and which calculates a motion limit needed to keep the work machine stable until the movable portion stops; and a command value generating unit which corrects command information to an actuator driving the movable portion, based on a result of the calculation of the stabilization control calculation unit, so that stability of the machine can be improved even when the control lever in the operating state is instantaneously brought back to the stop position.

According to this configuration, in the case where the control lever in the operating state is instantaneously brought back to the neutral position, the stabilization control calculation unit predicts a change in stability until each movable portion in the work machine completely stops and calculates a motion limit needed to keep the work machine stable at any time instant until each movable portion in the work machine completely stops, and the command value generating unit corrects command information to the actuator based on a result of the calculation. Thus, the stability of the work machine in an environment where inertia acts on the work machine can be evaluated accurately so that static and dynamic balance can be kept stably in the work machine. In addition, driving the actuator is controlled in consideration of the influence in the case where the control lever in the operating state is instantaneously brought back to the neutral position, that is, in the case where each movable portion in the work machine is stopped suddenly. Thus, the work machine can be prevented from tipping due to the sudden stop of the travel base or a front member as well as due to the sudden stop of the upperstructure. Further, in this case, the prediction of the change in stability and the calculation of the motion limit can be performed by a simple arithmetic operation. Thus, processing for stabilizing the work machine can be performed in real time.

In addition, according to the invention, there is provided a work machine in the aforementioned configuration, wherein: the stabilization control calculation unit calculates, as the motion limit, at least one of a slow stop command value for limiting deceleration of the movable portion to stop the movable portion slowly and a motion velocity upper limit for limiting a motion velocity of the actuator.

Generally, each movable portion in the work machine is driven in accordance with the contents of operation on the control lever. Accordingly, when the control lever in the operating state is instantaneously brought back to the neutral position, the movable portion driven in accordance with the operation on the control lever stops suddenly, and inertia occurs in accordance with deceleration at that time. Accordingly, even when the control lever in the operating state is instantaneously brought back to the neutral position, the inertia acting on the movable portion can be relaxed so that the work machine can be kept stable if deceleration of the movable portion is limited or the motion velocity of the actuator is limited in advance.

In addition, according to the invention, there is provided a work machine in the aforementioned configuration, wherein: the stabilization control calculation unit calculates the motion limit using at least one of ZMP coordinates calculated from position information, acceleration information and external force information as to each movable portion in the travel base, the work machine body and the work front, and mechanical energy calculated from position information and velocity information as to each movable portion of the work machine.

The ZMP (Zero Moment Point) coordinates are coordinates of a point of application in which a normal component of a floor reaction force applied to and distributed all over the portion where a structure is grounded on the ground surface is regarded as a component applied to a certain point. In addition, a ZMP stability determination creterion is based on the d'Alembert's principle, in which the ZMP coordinates are used as an evaluation index for determining the stability of the structure. When the ZMP coordinates exist inside a support polygon drawn by surrounding the grounded portion of the structure so as not to be concave (convex hull), it is determined that the structure is stably grounded on the ground surface. When the ZMP coordinates exist on a side of the support polygon, it is determined that the grounded portion of the structure is partially on the boundary where the grounded portion is about to float up from the ground surface. According to the ZMP stabilization determination rule, the stability of the structure can be evaluated in a quantitative way, while the existence of the possibility of tipping can be determined accurately. On the other hand, as for the mechanical energy, the structure is regarded as an inverted pendulum having a support on the support polygon when a part of the structure floats up. When the center of gravity in the structure arrives on a vertical line from the rotational center (ZMP) thereof, the structure overturns due to its own action of gravity. By use of this fact, whether the sum of the potential energy and the kinetic energy of the structure exceeds the potential energy at the highest point or not is calculated so that it can be determined whether the structure whose grounded portion partially floats up from the ground surface will overturn or not. In this manner, by use of these methods, it is possible to accurately determine the stability and the possibility of tipping of the work machine.

In addition, according to the invention, there is provided a work machine in the aforementioned configuration, wherein: the stabilization control calculation unit stores a limit of deceleration of the movable portion in advance, and corrects the command information to the actuator so as to satisfy the limit of the deceleration.

According to this configuration, the stabilization control calculation unit stores the limit of deceleration of the movable portion in advance. Thus, the command information to the actuator can be corrected easily based on the stored limit of the deceleration of the movable portion so that processing for stabilizing the work machine can be performed in real time.

In addition, according to the invention, there is provided a work machine in the aforementioned configuration, wherein:

the control device includes a behavior predicting unit for predicting behavior of the work machine in the case where the control lever in the operating state is instantaneously brought back to the stop command position; and the behavior predicting unit uses, as a model, a cubic function whose extreme values correspond to a velocity change start point expressed by a time instant when velocity starts to change and the velocity at that time instant, and a peak arrival point expressed by a time instant when an amount of change in velocity is the highest since release of the control lever and the velocity at that time instant, and uses an overshoot rate calculated based on the rate between velocity at the velocity change start point and velocity at the peak arrival point identified in advance for each motion of the travel base, the work machine body and the work front, a period of time between the release of the control lever and the velocity change start point, and a period of time between the velocity change start point and the peak arrival point.

In order to predict the behavior of the movable portion which is operated by the control lever and stopped suddenly when the control lever in the operating state is instantaneously brought back to the stop command position, it is necessary to calculate the position, velocity and acceleration loci of the movable portion until the movable portion completely stops. In this case, when the locus of the velocity at the sudden stop is modeled by a simple cubic function model, the loci of the position, the velocity and the acceleration at the sudden stop can be calculated easily. Thus, the behavior at the sudden stop can be predicted in real time.

Advantageous Effects of Invention

According to the invention, in the case where the control lever of the work machine in the operating state is instantaneously brought back to the stop command position, the control device provided in the work machine predicts a change in stability until each operated movable portion in the work machine completely stops, and calculates a motion limit needed to keep the work machine stable at any time instant until the movable portion in the work machine completely stops, and command information to the actuator driving the movable portion is corrected based on a result of the calculation. Thus, the stability of the work machine in an environment where inertia acts on the work machine can be evaluated accurately while the work machine can be prevented from tipping due to the sudden stop of the upperstructure, the travel base or the front member. In addition, the prediction of the change in the stability and the calculation of the motion limit can be performed by a simple arithmetic operation. Thus, processing for stabilizing the work machine can be performed in real time.

DESCRIPTION OF EMBODIMENT

Figure 1:
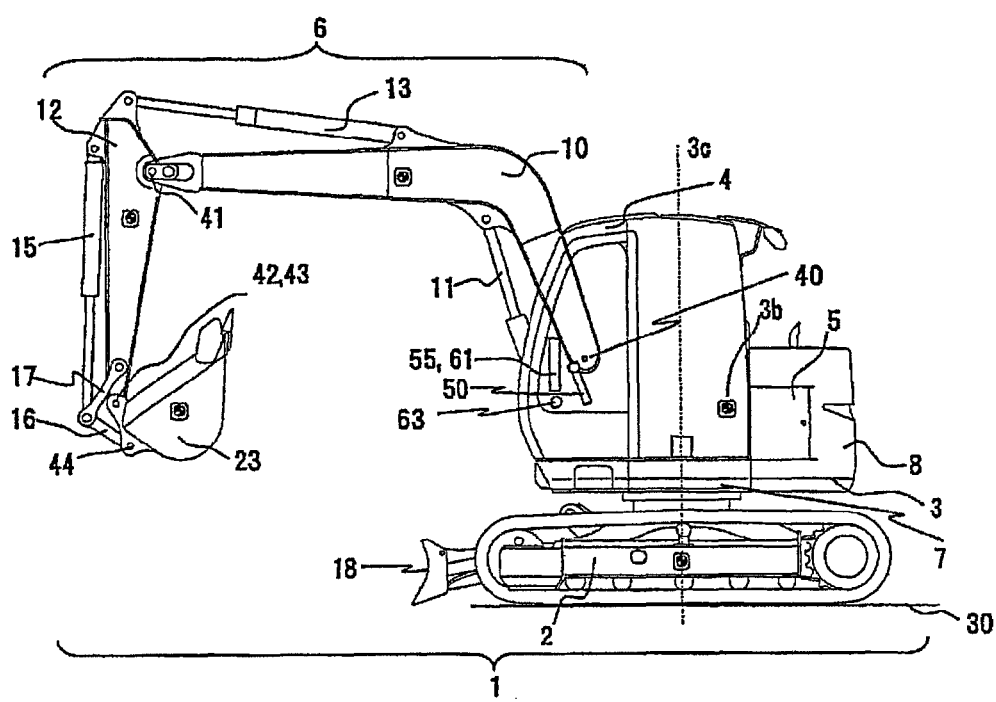
[FIG. 1] A side view of a work machine to which the present invention is applied.

An embodiment of a work machine according to the invention will be described below in accordance with its each item with reference to the drawings.
<Intended Apparatus>
As shown in FIG. 1, a work machine 1 according to the embodiment is provided with an travel base 2, an upperstructure 3 which is attached to an upper portion of the travel base 2 swingably, and a working front 6 including a multi-joint link mechanism whose one end is connected to the upperstructure 3. The upperstructure 3 is driven to swing around a center shaft 3c by a swing motor 7. An operator's cab 4 and a counterweight 8 are disposed on the upperstructure 3. An engine 5 forming a power system and an operation control device for controlling start/stop and overall motion of the work machine 1 are provided in a necessary portion on the upperstructure 3. Incidentally, the reference numeral 30 in the drawings designates a ground surface.

The work front 6 has a boom 10 whose one end is connected to the upperstructure 3, an arm 12 whose one end is connected to the other end of the boom 10, and a bucket 23 whose one end is connected to the other end of the arm 12. These members are configured to swing in an up/down direction individually. A boom cylinder 11 is a drive actuator which rotates the boom 10 around a fulcrum 40. The boom cylinder 11 is connected to the upperstructure 3 and the boom 10. An arm cylinder 13 is a drive actuator which rotates the arm 12 around a fulcrum 41. The arm cylinder 13 is connected to the boom 10 and the arm 12. A work tool cylinder 15 is a drive actuator which rotates the bucket 23 around a fulcrum 42. The work tool cylinder 15 is connected to the bucket 23 through a link 16 and connected to the arm 12 through a link 17. The bucket 23 may be replaced by any other not-shown work tool such as a grapple, a cutter or a breaker desirably.

Figure 2:
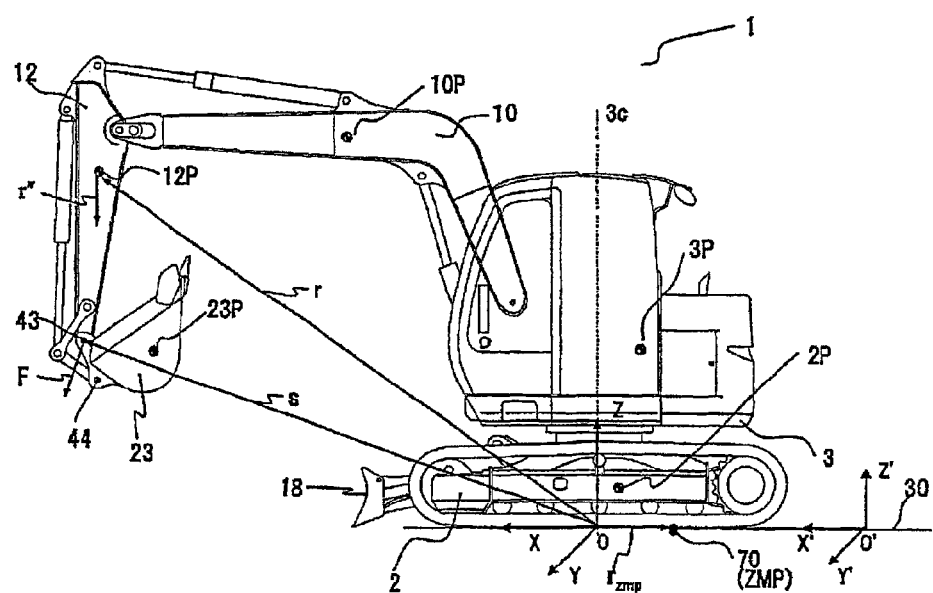
[FIG. 2] A view showing a work machine model for use in stabilization control calculation according to an embodiment.

A control lever 50 through which an operator inputs a motion command to each of the drive actuators, and a user setting input unit 55 through which the operator performs various kinds of settings are provided inside the operator's cab 4.
<Setting of Coordinate Systems>
FIG. 2 shows a work machine model (side view) for ZMP calculation, and a world coordinate system (O-X'Y'Z') and a machine reference coordinate system (O-XYZ) of the model. Both the world coordinate system (O-X'Y'Z') and the machine reference coordinate system (O-XYZ) are orthogonal coordinate systems. In the world coordinate system (O-X'Y'Z'), a reverse direction to gravity is set as Z-axis with reference to the gravity direction, as shown in FIG. 2. On the other hand, the machine reference coordinate system (O-XYZ) is set with reference to the travel base 2. As shown in FIG. 2, the origin is placed on a swing center line 3c of the upperstructure 3. A point O in contact with the ground surface 30 is set as the origin. An X-axis is set as a front/rear direction of the travel base 2, a Y-axis is set as a left/right direction thereof, and a Z-axis is set as the direction of the swing center line 3c. The relation between the world coordinate system and the machine reference coordinate system is detected by a posture sensor 3b attached to the upperstructure 3. The posture sensor 3b will be described more in detail in the following paragraph <State Quantity Detection Unit>.

<Model>

In addition, in the embodiment, mounting easiness is taken into consideration so that the work machine 1 is regarded as a lumped mass model in which masses are lumped in the centers of gravity of the respective constituent members in the stabilization control calculation. That is, as shown in FIG. 2, mass points 2P, 3P, 10P, 12P and 23P of the travel base 2, the upperstructure 3, the boom 10, the arm 12 and the bucket 23 are set at positions of the centers of gravity of the respective constituent members and masses of the mass points are set as m2, m3, m10, m12 and m23. Position vectors of the respective mass points are set as r2, r3, r10, r12 and r23. Velocity vectors of the respective mass points are set as r'2, r'3, r'10, r'12 and r'23. Acceleration vectors of the respective mass points are set as r"2, r"3, r"10, r"12 and r"23. Incidentally, the method for setting the mass points is not limited thereto. For example, any portion (the engine 5, the counterweight 8, etc. shown in FIG. 1) in which masses are lumped may be added.

<State Quantity Detection Unit>

Figure 3:
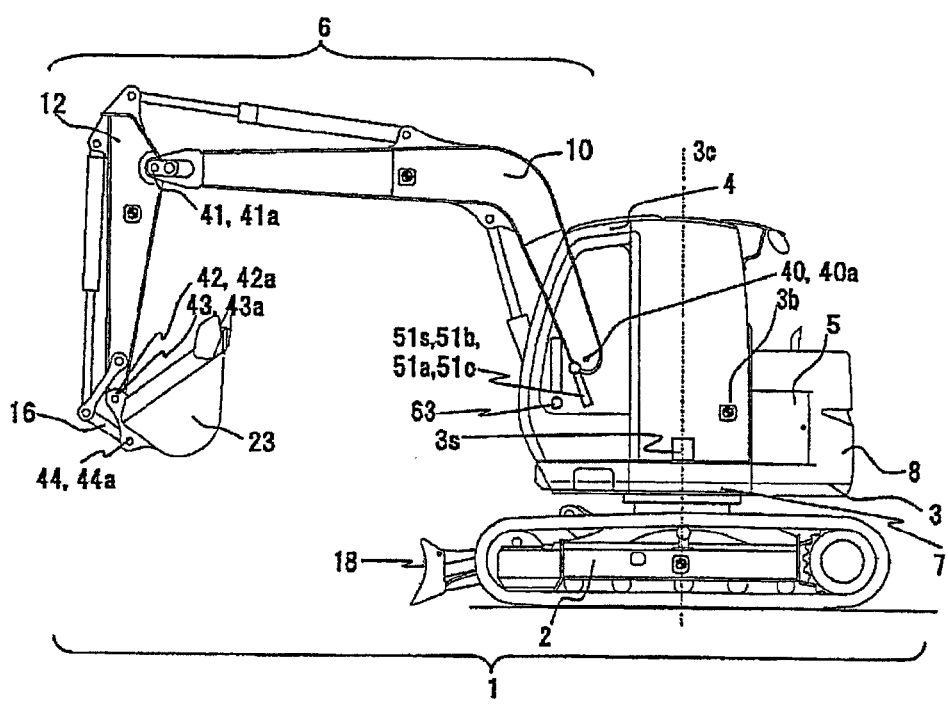
[FIG. 3] A side view showing the layout of sensors in the work machine to which the invention is applied.

A state quantity detection unit (sensor) attached to each portion of the work machine 1 will be described with reference to FIG. 3.

<Posture Sensor>

The posture sensor 3b for detecting the inclination of the machine reference coordinate system to the world coordinate system in which the reverse direction to the gravity as will be described later is set as the Z-axis is provided in the upperstructure 3. The posture sensor 3b is, for example, an inclination angle sensor which detects the inclination angle of the upperstructure 3 to thereby detect the inclination of the machine reference coordinate system to the world coordinate system.

<Angle Sensor>

A swing angle sensor 3s for detecting the swing angle between the travel base 2 and the upperstructure 3 is provided on the swing center line 3c of the upperstructure 3. In addition, a boom angle sensor (angle sensor) 40a for measuring the rotational angle of the boom 10 is provided in the fulcrum 40 between the upperstructure 3 and the boom 10. An arm angle sensor (angle sensor) 41a for measuring the rotational angle of the arm 12 is provided in the fulcrum 41 between the boom 10 and the arm 12. A bucket angle sensor 42a for measuring the rotational angle of the bucket 23 is provided in the fulcrum 42 between the arm 12 and the bucket 23.

<Pin Force Sensor>

Pin force sensors 43a and 44a are provided respectively in a pin 43 which connects the arm 12 and the bucket 23 and a pin 44 which connects the link 16 and the bucket 23. For example, each of the pin force sensors 43a and 44a measures strain occurring in a strain gauge inserted into the cylindrical interior of the pin force sensor 43a, 44a so as to detect the magnitude and direction of a force (external force) applied to the pin 43, 44. During working, the mass of the bucket portion changes due to the work such as digging performed by use of the bucket 23. The bucket 23 is connected to the work front 6 through the pins 43 and 44. Accordingly, external force vectors F43 and F44 applied to the pins 43 and 44 are calculated so that the change in the mass of the bucket 23 can be calculated. Incidentally, the position vectors of the pins 43 and 44 are set as s43 and s44 respectively.

<Level Operation Quantity Sensor>

A swing lever operation quantity sensor 51s which detects an input command quantity to the swing motor 7, a boom lever operation quantity sensor 51b which detects an input command quantity to the boom cylinder 11, an arm lever operation quantity sensor 51a which detects an input command quantity to the arm cylinder and a bucket lever operation quantity sensor 51o which detects an input command quantity to the work tool cylinder 15 are provided in the control lever 50.

<Control Device>

Figure 4:
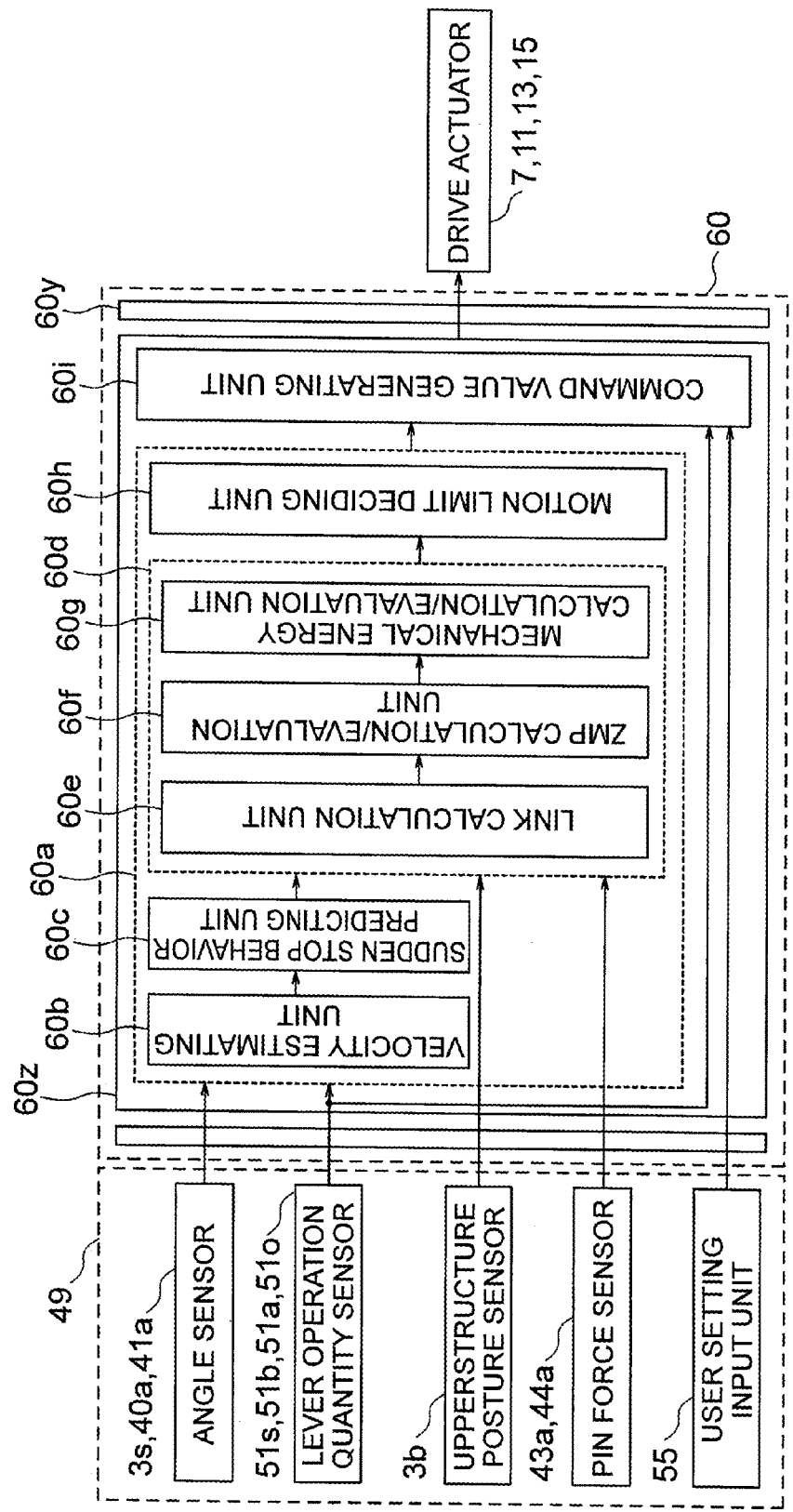
[FIG. 4] A functional block diagram of a control device according to the embodiment.

FIG. 4 is a functional block diagram of a control device provided in the work machine 1. The control device 60 is provided with an input unit 60x to which a signal from each sensor attached to each unit of the work machine 1 is inputted, a calculation unit 60z which receives the signal inputted to the input unit 60x and performs predetermined calculation, and an output unit 60y which receives an output signal from the calculation unit 60z and outputs a motion command to each drive actuator of the work machine 1.

The calculation unit 60z is constituted by storage units including a CPU (Central Processing Unit), an ROM (Read Only Memory), an RAM (Random Access Memory) and a flash memory, etc., which are not shown, a microcomputer and a not-shown peripheral circuit provided with these storage units, etc. The calculation unit 60z operates, for example, in accordance with a program stored in the ROM.

<Stability Evaluation Indices>

First, a stability determination system in the embodiment will be described before description of details of the calculation unit 60z. In the embodiment, two evaluation indices, i.e. ZMP (Zero Moment Point) and mechanical energy, are used for determining the stability of the work machine 1. The respective evaluation indices will be described below.

<ZMP>

A ZMP stability determination criterion is based on the d'Alembert's principle. Incidentally, the ZMP concept and the ZMP stability determination criterion are described in "LEGGED LOCOMOTION ROBOTS" written by Miomir Vukobratovic (published by The Nikkan Kogyo Shimbun, Ltd.).

The gravity, inertia, an external force, and a moment of these act on the ground surface 30 from the work machine 1 shown in FIG. 1. According to the d'Alembert's principle, these balance with a floor reaction force and a floor reaction force moment as reaction against the work machine 1 from the ground surface 30. Accordingly, when the work machine 1 is grounded stably on the ground surface 30, a point (ZMP) where a moment becomes zero in the direction of a pitch shaft and the direction of a roll shaft is present on one of sides of a support polygon or inside the support polygon, in which contact points between the work machine 1 and the ground surface 30 are connected so as not to be concave. Conversely, when the ZMP is present inside the support polygon, and a force acting on the ground surface 30 from the work machine 1 pushes the ground surface 30, that is, the floor reaction force is positive, it can be said that the work machine 1 is grounded stably. That is, as the ZMP is closer to the center of the support polygon, the stability is higher. When the ZMP is inside the support polygon, the work machine 1 can perform work without tipping. On the other hand, when the ZMP is present on the support polygon, there is a possibility that the work machine 1 may start to overturn. Accordingly, stability can be determined based on comparison between the ZMP and the support polygon formed by the work machine 1 and the ground surface 30.

<ZMP Equation>

A ZMP equation is derived in the following Equation (1) based on the balance among moments occurring due to the gravity, inertia and an external force.

[Math. 1]

$$\sum_i m_i(r_i - r_{zmp}) \times r''_i - \sum_j M_j - \sum_k (s_k - r_{zmp}) \times F_k = 0 \quad (1)$$

wherein:
$r_{zmp}$: ZMP position vector
$m_i$: mass of i-th mass point
$r_i$: position vector of i-th mass point
$r''_i$: acceleration vector added to i-th mass point (including gravity acceleration)
$M_j$: j-th external force moment
$s_k$: position vector of k-th external force application point
$F_k$: k-th external force vector Incidentally, the vector is a three-dimensional vector constituted by an X component, a Y component and a Z component.

The first item on the left side of Equation (1) expresses the sum of moments around ZMP 70 (with a radius $r_i\text{-}r_{zmp}$) (see FIG. 2) generated from an acceleration component (including gravity acceleration) applied in each mass point $m_i$. The second item on the left side of Equation (1) expresses the sum of external force moments M acting on the work machine 1. The third item on the left side of Equation (1) expresses the sum of moments around the ZMP 70 (with a radius $s_k\text{-}r_{zmp}$) generated from an external force $F_k$ (assume that a point of application of k-th external force vector $F_k$ is $s_k$). The equation (1) describes the balance among the sum of the moments around the ZMP 70 (with the radius $r_i\text{-}r_{zmp}$) generated from the acceleration component (including gravity acceleration) applied in each mass point $m_i$, the sum of the external force moments $M_j$, the sum of the moments around the ZMP 70 (with the radius $s_k\text{-}r_{zmp}$) generated from the external force $F_k$ (assume that the point of application of k-th external force $F_k$ is $s_k$). Based on the ZMP equation expressed in Equation (1), the ZMP 70 in the ground surface 30 can be calculated.

Here, a ZMP equation in the case where an object stops and only the gravity acts thereon is expressed as in Equation (2) by use of a gravity acceleration vector g so as to be coincident with a projected point of the static center of gravity on the ground surface.

[Math. 2]

$$\sum_i m_i(r_i - r_{zmp}) \times g = 0 \quad (2)$$

Accordingly, the ZMP can be regarded as a projected point of the center of gravity taking a dynamic state and a static state into consideration. By use of the ZMP as an index, both the case where the object is still and the case where the object makes a motion can be uniformly dealt with.

<Mechanical Energy>

In the embodiment, in addition to the ZMP, mechanical energy is also used as a stability evaluation index for determining the stability of the work machine 1. The aforementioned ZMP is useful for evaluating the stability in a quantitative way and determining the possibility of tipping. However, when the ZMP is on a side of the support polygon, a part of the travel base 2 floats up. This is a necessary condition for leading to tipping but does not mean that tipping will always happen if the ZMP is present on a side of the support polygon. That is, based on the ZMP, it is possible to determine whether the travel base 2 floats up or not but it is not possible to determine whether the work machine 1 will really overturn or not. Therefore, whether the work machine 1 will overturn or not is determined using the mechanical energy after a part of the travel base 2 floats up. The work machine 1 may be regarded as an inverted pendulum having a support on the support polygon when a part of the travel base 2 floats up. When the center of gravity in the work machine 1 arrives on a vertical line from the rotational center (ZMP) thereof, the work machine 1 overturns due to its own action of gravity. Therefore, when whether the center of gravity will reach the highest point or not is determined, whether the work machine 1 will overturn in the future or not can be determined. The center of gravity reaches the highest point when the sum of the potential energy (PE) and the kinetic energy (KE) of the machine exceeds the potential energy (PEMAX) at the highest point. Accordingly, the determination of tipping is performed using the following Equation (3). Incidentally, this evaluation is effective only when a part of the travel base floats up.

[Math. 3]

$$PE + KE \geq PE_{MAX} \quad (3)$$
$$PE = Mgl\sin\theta$$
$$KE = \frac{1}{2}I\omega^2$$
$$PE_{MAX} = Mgl$$

wherein:
θ: inclination of inverted pendulum (center of gravity in work machine 1) to ground surface
ω: angular velocity of inverted pendulum
M: mass of work machine 1
I: inertia moment around rotation fulcrum
l: radius of rotation <Slow Stop>

In the embodiment, a motion velocity limit and a slow stop are performed as motion limits for stabilization. Here, the slow stop will be described.

The slow stop means that deceleration of a movable portion at a stop time is limited so as to stop the movable portion slowly. Due to the slow stop, acceleration at a sudden stop can be suppressed so that the influence of inertia can be reduced to suppress destabilization. On the other hand, the slow stop increases the braking distance. Therefore, an allowable braking distance is defined in advance, and the slow stop needs to be performed so that the movable portion can stop within the allowable braking distance.

Figure 5A:
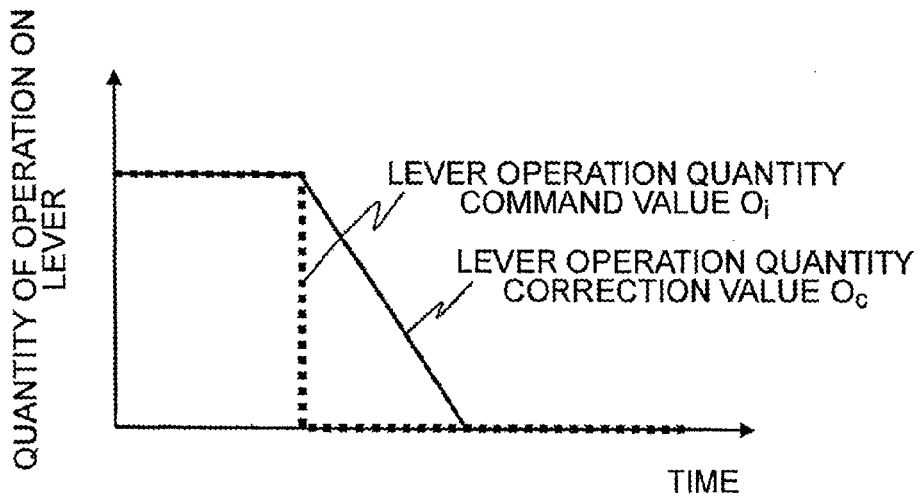
[FIG. 5] Graphs showing an example of a slow stop method according to the embodiment.

Various methods may be considered for the slow stop. Here, the case where a lever operation quantity (or lever operation velocity) is reduced monotonously as shown in FIG. 5(a) will be described by way of example. In the case of FIG. 5(a), the inclination of a change in the lever operation quantity is limited to k. That is, the corrected lever operation quantity can be expressed as follows:

$$O_c(t + \Delta t) = \begin{cases} O_i(t + \Delta t) & (\text{when } O_i(t + \Delta t) - O_i(t) < k\Delta t) \\ O_i(t) - k\Delta t & (\text{when } O_i(t + \Delta t) - O_i(t) \geq k\Delta t) \end{cases} \quad [\text{Math. 4}]$$

Here, $O_i(t)$ designates a lever operation quantity command value at a time instant t, and $O_c(t)$ designates a lever operation quantity correction value at the time instant t.

Figure 5B:
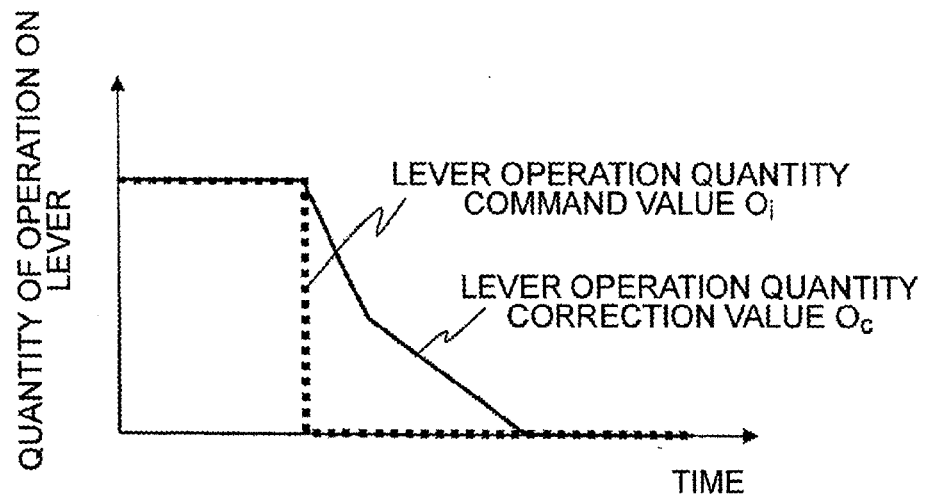

The following method may be considered as another slow stop method. That is, the limit value for the inclination of the change of the lever operation quantity is changed over in accordance with the lever operation quantity or the lever operation velocity, as shown in FIG. 5(b). In this case, the point for changing over the inclination and the inclination are set suitably so that the acceleration at the sudden stop time can be suppressed to be low while keeping the braking distance comparatively short.

The configuration of the calculation unit 60z will be described below with reference to FIG. 4.

<Calculation Unit>

The calculation unit 60z is constituted by a stabilization control calculation unit 60a for calculating a motion limit needed for stabilization in accordance with signals imported from each sensor and the user setting input unit 55 provided in the work machine 1, and a command value generating unit 60i for correcting a command value to each drive actuator based on an output from the stabilization control calculation unit 60a.

<Stabilization Control Calculation Unit>

The stabilization control calculation unit 60a calculates a motion limit to prevent tipping in spite of a sudden stop. Here, the sudden stop means an operation in which the control lever in the operating state is instantaneously brought back to the stop command position. The aforementioned operation may be performed for dealing with a sudden and unexpected obstacle, warning, etc. or due to an operational error etc. In such a case, the velocity decreases rapidly and the stable state of the work machine 1 deteriorates easily due to inertia occurring at that time. A method in which some avoidance motion is taken in the instable state may be considered as a method for dealing with the case where the stable state has deteriorated. However, the motion different from a motion intended by the operator gives a feeling of wrongness to the operator, and there is a risk that damage may be caused to workers or substances in the surroundings. Therefore, in the stabilization control according to the invention, an allowable braking distance is defined in advance, and a slow stop is performed if necessary. In addition, the motion velocity is limited beforehand so that the work machine can be stopped safely within the predetermined allowable braking distance at any case. That is, in the stabilization control according to the invention, the slow stop and the motion limit based on the motion velocity limit are performed based on the prediction of behavior and the stabilization evaluation at the sudden stop time, so that destabilization can be prevented from occurring. Incidentally, the stabilization control calculation unit 60a performs calculation based on the machine reference coordinate system.

The method for calculating the motion limit for stabilization may include a method for performing backward calculation from stability conditions and a method using forward calculation in which prediction of behavior and evaluation of stability are repeated a plurality of times while the motion limit is changed. In the former, an optimum motion limit can be calculated by one single arithmetic operation, but a complicated arithmetic Equation must be derived. On the other hand, in the latter, a plurality of trials must be carried out, but a comparatively simple arithmetic Equation can be used. The following description will be made using the latter method by way of example.

As shown in FIG. 4, the stabilization control calculation unit 60a has functional blocks of a velocity estimating unit 60b, a sudden stop behavior predicting unit 60c, a stability determining unit 60d and a motion limit deciding unit 60h. The details of the respective functional blocks will be described below.

<Velocity Estimation>

Generally, the motion velocity of a hydraulic cylinder provided in a hydraulic excavator is proportional to the quantity of operation on a control lever. In addition, due to oil pressure and mechanism, there is a delay between the lever operation and the motion velocity. It is therefore possible to predict a near-future state using information about the quantity of operation on the lever. In the velocity estimating unit 60b, a near-future motion velocity is predicted using a past quantity of operation on the lever, a current quantity of operation on the lever and a current motion velocity. Estimation is carried out in the following two steps. First, a velocity calculation model is identified based on the past quantity of operation on the lever and the current motion velocity. Next, the current quantity of operation on the lever is supplied as an input to the identified velocity calculation model so as to predict a near-future motion velocity. The velocity calculation model is expected to change from moment to moment due to the engine speed, the magnitude of a load, the posture, the oil temperature, etc. However, the working condition has a small change in a very small period of time. The change of the model may be also regarded as small. As an easier method for implementing the velocity estimating unit 60b, there is a method using a dead time $T_L$ between the time when the lever is operated and the time when the cylinder begins to run and a proportionality coefficient $\alpha_v$ which will be defined later. Here, the dead time $T_L$ is assumed to be not changed, and is obtained in advance by experiments. The velocity after $T_L$ seconds is calculated in the following procedure.

Step 1: The proportionality coefficient $\alpha_v$ is calculated using the following Equation (5) based on the quantity of operation on the lever $O_i(t-T_L)$ before $T_L$ seconds and the current velocity v(t).

[Math. 5]

$$\alpha_v = v(t)/O_i(t-t_L) \quad (5)$$

Step 2: An estimated velocity value $v(t+T_L)$ after $T_L$ seconds is calculated using the following Equation (6) based on the calculated proportionality coefficient $\alpha_v$ and the current quantity of operation on the lever $O_i(t)$.

[Math. 6]

$$v(t+t_L) = \alpha_v O_i(t) \quad (6)$$

<Sudden Stop Behavior Prediction>

The sudden stop behavior predicting unit 60c predicts the behavior of the work machine 1 when a sudden stop command is issued. The loci of the position, the velocity and the acceleration until reaching the complete stop after the control lever is released are calculated from information about current posture, a velocity estimation result of the velocity estimating unit 60b, and a sudden stop model. For example, a method in which the locus of the velocity at a sudden stop is modeled to calculate the locus of the position and the locus of the acceleration from the locus of the velocity may be considered as the sudden stop model. Assume that the velocity locus at a sudden stop is modeled in advance, and a sudden stop motion starts (the control lever is released) at a time instant t. On this occasion, when $v_{stop}(t,t_e)$ designates the cylinder velocity after $t_e$ seconds since a time instant when the control lever is released, cylinder length $l_{stop}(t,t_e)$ and cylinder acceleration $a_{stop}(t,t_e)$ after $t_e$ seconds are calculated by the following Equation (7) using the cylinder length $l_{stop}(t,0)$ at the time of start of the sudden stop.

[Math. 7]

$$l_{stop}(t, t_e) = l_{stop}(t, 0) + \int_0^{t_e} v_{stop}(t, u) du \quad (7)$$

$$a_{stop}(t, t_e) = \left. \frac{v_{stop}(t, u)}{du} \right|_{u=t_e}$$

In order to predict the behavior at the sudden stop in real time, the velocity locus at the sudden stop may be modeled by a simple model. A first-order time lag system, a multi-order time lag system and a polynomial function may be generally considered as typical examples of the simple model of the velocity locus at the sudden stop. Incidentally, when a slow stop is performed, similar modeling is carried out for each of selectable slow stops in addition to the sudden stop motion.

<Modeling Using Cubic Function Model>

Figure 6:
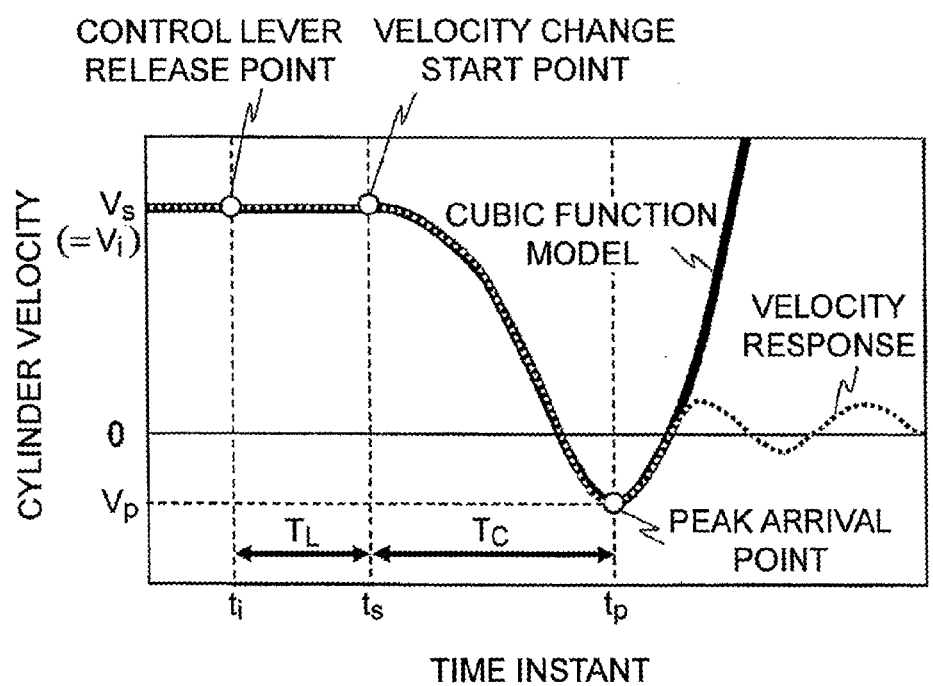
[FIG. 6] A graph showing an example of a sudden stop model for use in a sudden stop behavior predicting unit according to the embodiment.

Modeling and a method for predicting the behavior at a sudden stop will be described blow in the case where a cubic function model is used byway of example. FIG. 6 shows a cubic function model used in the embodiment. The cubic function model is of a cubic function whose extreme values correspond to a velocity change start point and a peak arrival point. Assume that $t_i$ designates a time instant when the control lever is released, $t_s$ designates a time instant when the velocity begins to change, $t_p$ designates a time instant when the velocity arrives at a peak, $v_s$ designates a velocity at the time instant when the velocity begins to change, and $v_p$ designates a peak velocity. When the quantity of operation on the lever is assumed to be constant before the sudden stop starts, the velocity $v_s$ at the time instant when the velocity begins to change is regarded as $v_s=v_i$ because it is equal to the velocity at the time instant when the control lever is released. In modeling, the maximum quantity of change in velocity relative to the velocity at the time instant when the velocity begins to change is defined as overshoot rate $\alpha_O$; the period of time between the time instant when the control lever is released and the time instant when the velocity begins to change is defined as dead time $T_L$; and the period of time between the time instant when the velocity begins to change and the time instant when the velocity arrives at the peak is defined as stop completion time $T_C$. The aforementioned three parameters are identified for each motion of the boom 10, the arm 12 and the upperstructure 3.

[Math. 8]

$$\alpha_O = (v_i - v_p)/v_i$$

$$T_L = t_s - t_i$$

$$T_C = t_p - t_s \quad (8)$$

When a slow stop is performed, similar modeling is carried out for each of selectable slow stop settings in addition to the sudden stop. The aforementioned three parameters are set for each setting and each motion. The velocity locus $v_{stop}(t_i, t_e)$ can be expressed by the following Equation (9) using the overshoot rate, the dead time, the stop completion time and the velocity at the time instant when the control lever is released. An estimated result by the velocity estimating unit is used as the velocity at the time instant when the control lever is released.

[Math. 9]

$$v_{stop}(t_i, t_e) = \begin{cases} v_i & (t_e \leq T_L) \\ a_v t_e^3 + b_v t_e^2 + c_v t_e + d_v & (t_e > T_L) \end{cases} \quad (9)$$

$$a_v = 2\alpha_O v_i / T_C^3$$

$$b_v = -a_v(2t_i + 2T_L + T_C)/2$$

$$c_v = 3a_v(t_i + T_L + T_C)$$

$$d_v = v_i - a_v(t_i + T_L)^3 - b_v(t_i + T_L)^2 - c_v(t_i + T_L)$$

On this occasion, the cylinder length locus and the acceleration locus can be calculated by the following Equation (10).

[Math. 10]

$$l_{stop}(t_i, t_e) = \begin{cases} v_i t_e & (t_e \leq T_L) \\ \frac{1}{4}a_v t_e^4 + \frac{1}{3}b_v t_e^3 + \frac{1}{2}c_v t_e^2 + d_v t_e + v_i T_L + l_i & (t_e > T_L) \end{cases} \quad (10)$$

$$a_{stop}(t_i, t_e) = 3a_v t_e^2 + 2b_v t_e + c_v$$

wherein:

$L_i$: cylinder length at the time instant when the control lever is released.

<Stability Determining Unit>

In the stability determining unit 60d, ZMP or mechanical energy is calculated in accordance with necessity from the sudden stop loci estimated in the sudden stop behavior prediction unit 60c based on the aforementioned two stability evaluation indices, and it is determined whether occurrence of destabilization can be prevented at any point or not. In the embodiment, stability evaluation is performed using the aforementioned ZMP and mechanical energy.

Figure 7:
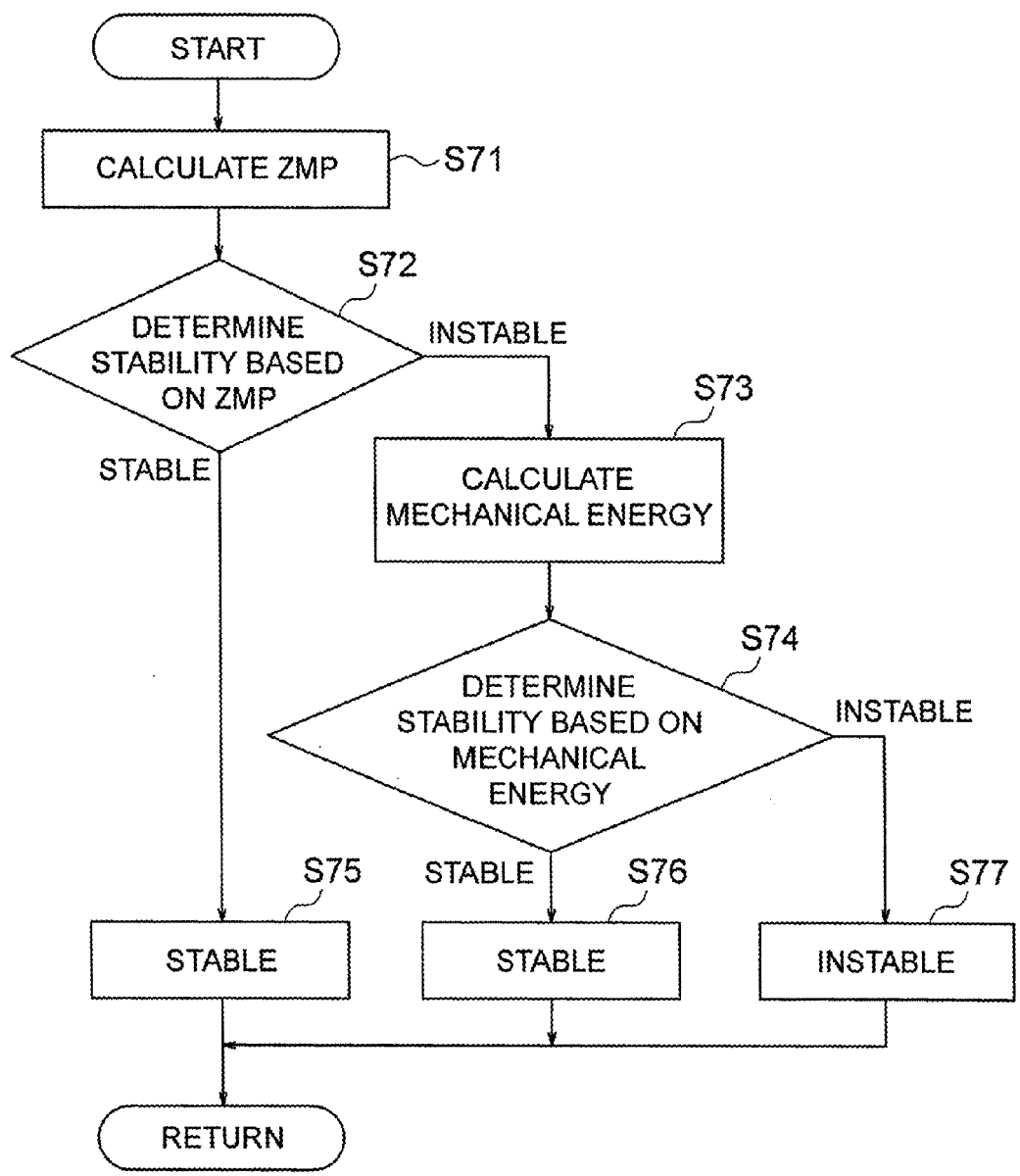
[FIG. 7] A flow chart showing the procedure of a stability evaluation method performed by a stability determination unit according to the embodiment.

A flow of stability evaluation will be described below with reference to FIG. 7. As described above, ZMP is effective in stability evaluation when the work machine 1 is grounded stably, but cannot be used for evaluation after the travel base 2 begins to float. On the other hand, tipping determination based on mechanical energy is effective only in the state where a part of the travel base 2 has floated up, but cannot be used for stability evaluation when the machine is grounded stably. Therefore, the ZMP is always monitored, and it is determined whether the ZMP is within a normal region J set within a support polygon or not. When the ZMP is within the normal region J, stability evaluation based on the ZMP is performed. When the ZMP is out of the normal region J, evaluation based on the mechanical energy is performed. Determination is made as "instable" when the mechanical energy satisfies the Equation (3) and as "stable" when the mechanical energy does not satisfy the Equation (3).

<Link Operation>

In a link calculation unit 60e, kinematic calculation is performed sequentially on each link using the result of prediction by the sudden stop behavior predicting unit 60c. Position vector loci $r_2$, $r_3$, $r_{10}$, $r_{12}$, and $r_{23}$ velocity vector loci $r'_2$, $r'_3$, $r'_{10}$, $r'_{12}$ and $r'_{23}$ and acceleration vector loci $r''_2$, $r''_3$, $r''_{10}$, $r''_{12}$ and $r''_{23}$ at the mass points 2P, 3P, 10P, 12P and 23P shown in FIG. 2 are converted into values based on the machine reference coordinate system (O-XYZ). Here, a well-known method can be used as a method for the kinematic calculation. For example, a method described in "Fundamentals of Robot Control", written by Tsuneo Yoshikawa and published by Corona Publishing Co., Ltd. (1988) can be used.

<ZMP Calculation/Evaluation Unit>

A ZMP calculation/evaluation unit 60f calculates the locus of ZMP 70 using position vector loci and acceleration vector loci of respective mass points converted into the machine reference coordinate system by the link calculation unit 60e (Step S71), and performs stability evaluation (Step S72). Assuming that the Z-coordinate of the ZMP is located on the ground surface 30 in the embodiment because the origin O of the machine reference coordinate system is set at the point where the travel base 2 and the ground surface 30 are in contact with each other, $r_{zmpz}=0$. On the other hand, almost no external force or external force moment usually acts on portions other than the bucket 23 in the work machine 1 so that the influence of the external force or the external force moment can be ignored, and the external force moment M can be regarded as 0 (M=0). The Equation (1) is solved under such conditions, and the X-coordinate $r_{zmpx}$ of the ZMP 70 is calculated by the follow Equation (11).

[Math. 11]

$$r_{zmpx} = \frac{\sum_i m_i(r_{ix}r''_{iz} - r_{iz}r''_{ix}) - \sum_k (s_{kx}F_{kz} - s_{kz}F_{kx})}{\sum_i m_i r''_{iz} - \sum_k F_{kz}} \quad (11)$$

Similarly to this, the Y-coordinate $r_{zmpy}$ of the ZMP 70 is calculated by the following Equation (12).

[Math. 12]

$$r_{zmpy} = \frac{\sum_i m_i(r_{iy}r''_{iz} - r_{iz}r''_{iy}) - \sum_k (s_{ky}F_{kz} - s_{kz}F_{ky})}{\sum_i m_i r''_{iz} - \sum_k F_{kz}} \quad (12)$$

In Equations (11) and (12), m designates mass at each of the mass points 2P, 3P, 10P, 12P and 23P shown in FIG. 2, and the masses $m_2$, $m_3$, $m_{10}$, $m_{12}$ and $m_{23}$ at the respective mass points are substituted for m. Incidentally, the mass $m_{23}$ of the bucket 23 is expected to change in accordance with work. Therefore, the mass $m_{23}$ calculated from the detection values of the pin force sensors 43a and 44a is used. r" designates acceleration at each mass point, and the accelerations $r''_2$, $r''_3$, $r''_{10}$, $r''_{12}$ and $r''_{23}$ at the respective mass points are substituted for r". As described above, the ZMP calculation/evaluation unit 60f can calculate the locus of the ZMP 70 using the result of prediction by the sudden stop behavior predicting unit.

Figure 8:
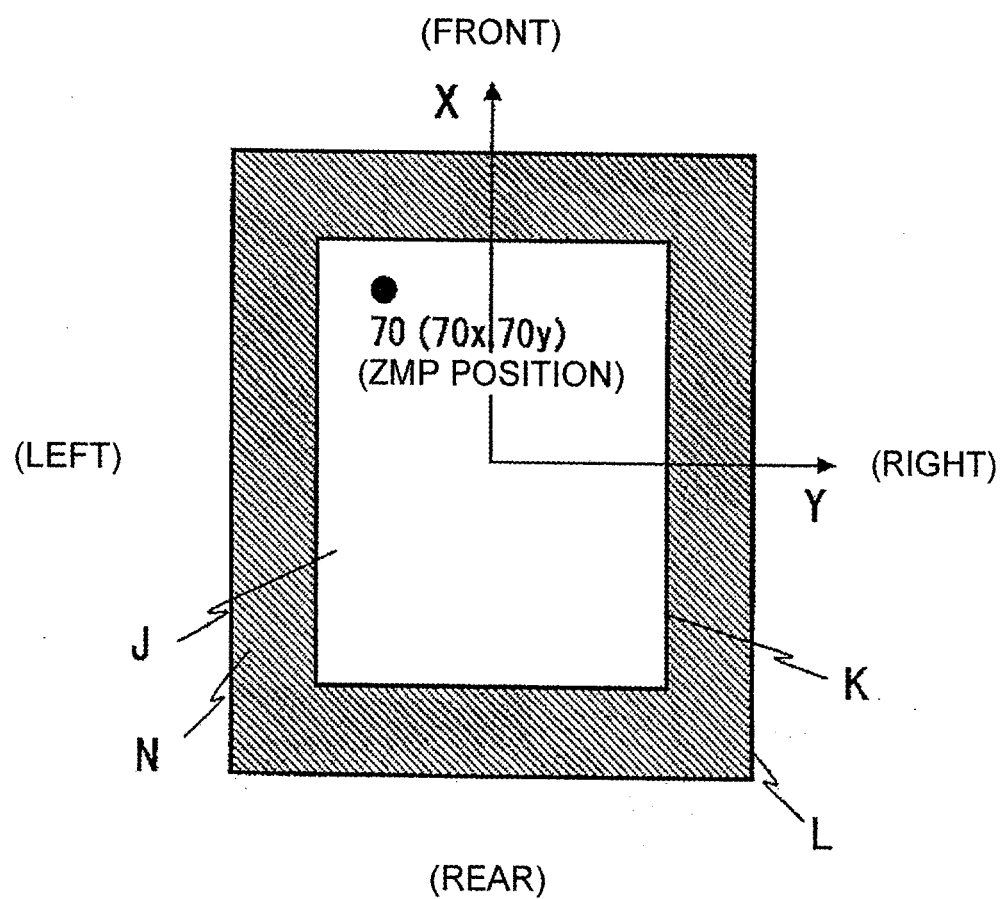
[FIG. 8] An explanatory view of the stability evaluation method performed in a ZMP calculation/evaluation unit according to the embodiment.

Next, with reference to FIG. 8, description will be made about calculation of stability and determination of an tipping possibility based on region determination performed by the ZMP calculation/evaluation unit 60f based on the locus of the ZMP 70.

When the ZMP 70 is present in an region on the sufficiently inner side of the support polygon L formed by the work machine 1 and the ground surface 30 as described above, there is almost no possibility that the work machine 1 shown in FIG. 1 may overturn so that the work machine 1 can perform work safely. The ZMP calculation/evaluation unit 60f in the first embodiment calculates a support polygon L formed by the points where the work machine 1 is grounded on the ground surface 30. The ZMP calculation/evaluation unit 60f sets a normal region J where the possibility of tipping is sufficiently low and an tipping warning region N where the possibility of tipping is higher. The ZMP calculation/evaluation unit 60f determines stability based on whether the ZMP 70 is located in the normal region J or the tipping warning region N. When the travel base 2 erectly stands on the ground surface 30, the support polygon L substantially coincides with the planar shape of the travel base 2. Accordingly, when the planar shape of the travel base 2 is rectangular, the support polygon L has a rectangular shape as shown in FIG. 8. More specifically, when a crawler is provided as the travel base 2, the support polygon L has a quadrangular shape including a front boundary on the line connecting the center points of left and right sprockets, a rear boundary on the line connecting the center points of left and right idlers, and left and right boundaries on the outer ends of left and right track links. Incidentally, the front and rear boundaries may be replaced by grounded points of a frontmost lower roller and a rearmost lower roller.

On the other hand, the work machine 1 shown in FIG. 1 has a blade 18. When the blade 18 is grounded on the ground surface 30, the support polygon L expands to include the blade bottom portion. In addition, in a jack-up motion in which the bucket 23 is pressed onto the ground surface to lift up the travel base 2, the support polygon L is made into a polygon formed by the two endpoints on the grounded side of the travel base 2 and the grounded points of the bucket 23. Since the shape of the support polygon L changes discontinuously in accordance with the grounded state of the work machine 1 in this manner, the ZMP calculation/evaluation unit 60f monitors the grounded state of the work machine 1 and sets the support polygon L in accordance with the grounded state.

For the evaluation of stability, a boundary K between the normal region J and the tipping warning region N is set on the inner side of the support polygon L. Specifically, the boundary K is set on a polygon obtained by reducing the support polygon L on the center point side in accordance with a ratio decided with a safety factor or on a polygon obtained by moving the support polygon L inward by a length decided with the safety factor. When the ZMP 70 is located in the normal region J, determination is made that the work machine 1 is sufficiently high in stability. On the other hand, when the ZMP 70 is located in the tipping warning region N, determination is made that there is a possibility that the work machine may overturn.

As described above, when the ZMP is located within the normal region J, determination is made that the work machine is "stable", and this determination result is outputted from the stability determining unit 60d (Step S75). On the other hand, when the ZMP is located within the tipping warning region N, determination is made that there is a high possibility that a part of the travel base may float up. The mechanical energy is calculated (Step S73) and the stability is determined based on the mechanical energy (Step S74). That is, the mechanical energy may be calculated in an earlier stage as the tipping warning region N is larger. The dimensions of the tipping warning region N may be decided in consideration of the estimated error of the ZMP locus, and so on.

<Mechanical Energy Calculation/Evaluation Unit 60g>

When the floating-up of the travel base 2 is predicted in the ZMP calculation/evaluation unit 60f, the gravity center position locus of the work machine 1 is calculated using the position vector locus and the velocity vector locus at each mass point calculated in the link calculation unit 60e. The kinetic energy, the potential energy and the radius of rotation shown in Equation (3) are calculated, and the stability is determined based on the mechanical energy. That is, whether tipping will occur or not can be determined by the determination as to whether Equation (3) is satisfied or not.

In the first embodiment, a safety factor $S_e$ is set in consideration of the influence of a measuring error, a modeling error, a working environment, etc. and for the sake of control intervention suited to the skill level or preference of the operator. As a method for setting the safety factor, for example, it may be considered that the safety factor is set with respect to a threshold for use in tipping determination. That is, Equation (3) is replaced by the following Equation (13) for the determination of stability.

[Math. 13]

$$PE + KE \geq PE_{MAX}/S_e \qquad (13)$$

When Equation (13) is not satisfied, it is determined that the possibility of tipping is low, and the result of determination in the stability determining unit is outputted as "stable" (Step S76). When Equation (13) is satisfied, it is determined that the possibility of tipping is high, and the result of determination is outputted as "instable" (Step S77).

A method for reflecting the safety factor on calculation of kinetic energy may be considered as another method for setting the safety factor. On this occasion, the kinetic energy can be calculated by the following Equation (14).

[Math. 14]

$$KE' = I(S_e \omega)^2/2 \qquad (14)$$

In the case of this example, stability is determined based on Equation (3) using KE' in place of KE, and "stable" or "instable" is outputted as a determination result of the stability determining unit. The safety factor is reflected on the calculation of kinetic energy in this manner. Thus, the velocity can be adjusted easily based on the safety factor.

Incidentally, the safety factor may be set at a predetermined value in advance, or may be a value that can be changed in accordance with the skill level of the operator operating the work machine 1, the contents of working, the condition of a road surface or the surroundings, etc. In this case, configuration may be conceived so that the safety factor can be set automatically from information given in advance, output values from various sensors, etc., or the safety factor can be set optionally by an operator or a work manager using the user setting input device 55.

The safety factor may be changed during work in accordance with the working condition of the work machine 1, or another configuration using different values for the front, the rear, the left and the right respectively may be made. Configuration may be conceived as the method for setting the safety factor so that the operator or the work manager can change the setting manually at any time or may use GPS, map information, CAD drawings of work, etc. By use of the aforementioned information, a direction in which tipping may occur easily or a direction in which heavy damage may be anticipated at the time of tipping can be identified automatically, and settings can be changed automatically to increase the safety factor in that direction. In this manner, the safety factor is set at a proper value so that safe work can be performed without lowering the working efficiency.

<Motion Limit Deciding Unit>

In the motion limit deciding unit 60h, whether further repeated calculation is required or not is determined based on the determination result of the safety determining unit 60d. Thus, a command value correction command is generated. In the stabilization control according to this embodiment, a slow stop and a motion velocity limit are performed in order to avoid destabilization. Thus, the motion limit deciding unit 60h outputs a slow stop setting and a motion velocity limit gain to the command value generating unit 60i.

Figure 9:
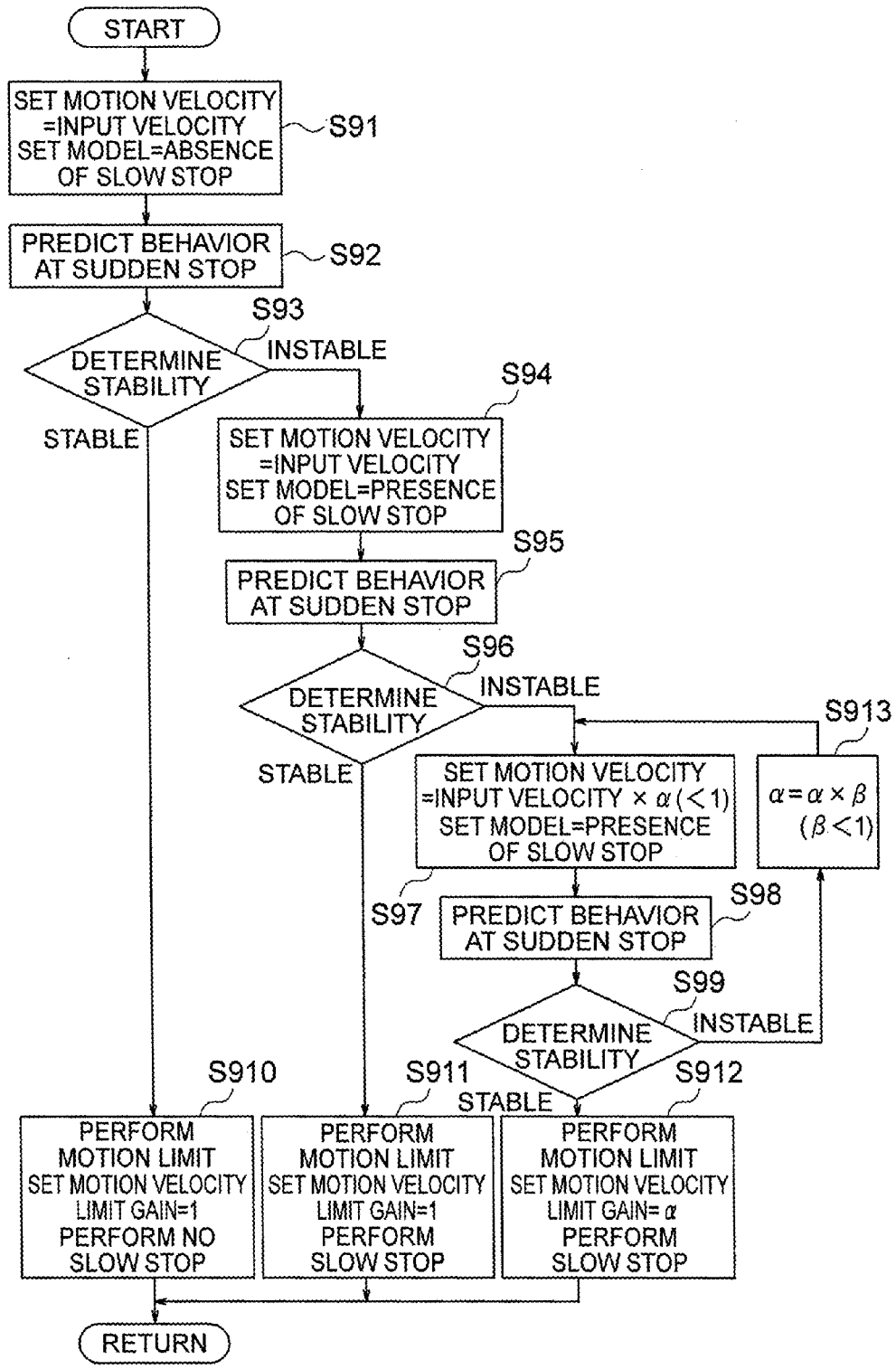
[FIG. 9] A flow chart showing the procedure of a repeated calculation method performed in a motion limit decision unit according to the embodiment.

Next, a flow of repeated calculation will be described with reference to FIG. 9. In the first trial, setting is made using an estimation result of the velocity estimating unit 60b and a sudden stop model (Step S91), and behavior prediction (Step S92) and stability determination (Step S93) are performed. When the determination result of the stability determining unit 60d is "stable", command values are not corrected. In this case, "no slow stop" and "motion velocity limit gain=1" are outputted (Step S910). On the other hand, when the determination result of the stability determining unit 60d is "instable", setting is made using a slow stop model in place of the sudden stop model (Step S94), and behavior prediction (Step S95) and stability determination (Step S96) are performed. When the determination result of the stability determining unit 60d is "stable", the motion velocity limit gain is set at 1, and the command value correction command 60i is issued to perform only the slow stop (Step S911). On the other hand, when the determination result of the stability determining unit 60d is "instable", setting is made using a value obtained by multiplying the estimated velocity value by a motion velocity limit gain $\alpha$ (<1), and the slow stop model (Step S97), and behavior prediction (Step S98) and stability determination (Step S99) are performed. When the determination result of the stability determining unit 60d is "stable", a command value correction command is issued to perform the slow stop command and the motion limit using the motion velocity limit gain $\alpha$ (Step S912). On the other hand, when the determination result of the stability determining unit 60d is "instable", the motion velocity limit gain $\alpha$ is reduced gradually and behavior prediction (Step S98) and stability determination (Step S99) are repeated till the determination result of the stability determining unit 60d is "stable".

Although the case where the number of patterns as the slow stop is one was described in the aforementioned embodiment by way of example, a plurality of settings for the slow stop may be provided. In this case, the velocity is not reduced unless the stability determination result is instable in all the slow stop settings.

In the aforementioned embodiment, the method has been shown in such a manner that a stable limit velocity is calculated by forward calculation in which stability evaluation is performed on all the points until reaching a sudden stop or a stop on the locus of a slow stop, and the stability evaluation is repeated with the velocity reduced gradually until "stable" at any of the points is determined. Practically, however, the number of points to be calculated on the stop locus and the number of trials in the repeated calculation may be decided in consideration of the arithmetic processing capability of a controller. In addition, the intervals of the points to be calculated do not have to be always equal intervals.

<Command Value Generating Unit>

In the command value generating unit 60i, the quantity of operation on the lever is corrected and input values to various drive actuators are generated and outputted to an output unit 60y, based on the command value correction command outputted from the motion limit deciding unit 60h. More specifically, a value obtained by multiplying the quantity of operation on the lever by the motion velocity limit gain $\alpha$ is set as a command value. When there is a slow stop command, the quantity of operation on the lever is corrected and outputted based on the aforementioned Equation (4).

<User Setting Input Unit>

The user setting input unit 55 is constituted by a plurality of input buttons and so on. The operator makes settings including a warning method, the safety factor, etc. in accordance with the contents of work and the operator's personal preference through the user setting input unit 55.

<Warning Device>

In addition, as shown in FIG. 1, configuration may be made in such a manner that a warning device 63 is installed in the operator's cab 4 so as to issue a warning to the operator at the time of intervention of stabilization control or in accordance with stability.

<Display Device>

Further, as shown in FIG. 1, configuration may be made in such a manner that a display device 61 is installed in the operator's cab 4 so as to display a current stability state, a change in stability state or current settings. In addition, configuration may be made in such a manner that a warning is issued to the operator using the display device 61 in accordance with the stability. In this manner, the operator can be informed of the stability state of the work machine 1 by means of the display device 61 or the warning device 63 installed in the operator's cab 4. Thus, the operation of the operator on the control lever 50 can be guided to a more suitable operation to secure safety in the work machine 1.

Other embodiments of the work machine according to the invention will be listed below.

(1) The example in which the mass points 2P, 3P, 10P, 12P and 23P belonging to the travel base 2, the upperstructure 3, the boom 10, the arm 12 and the bucket 23 respectively are used in the stabilization control calculation unit 60a has been shown in the aforementioned embodiment. However, the number of mass points for use in calculation may be reduced in such a way that some mass points are merged or mass points having a significant impact are extracted. Due to the reduction in the number of mass point, the calculation quantity can be reduced.

(2) The example in which the work machine 1 is handled as a lumped mass model in which masses are lumped in the centers of gravity of the respective constituent members has been shown in the aforementioned embodiment. However, configuration may be made based on another modeling form including a rigid body model.

(3) The example in which the estimation result of the velocity estimating unit 60b is used in the sudden stop behavior predicting unit 60c has been shown in the aforementioned embodiment. However, the velocity used in the sudden stop behavior predicting unit 60c may be a current motion velocity calculated from an output value of an angle sensor. In that case, the velocity estimating unit 60b may be removed from the configuration.

(4) The example in which two indices including ZMP and mechanical energy are used as indices for evaluating stability has been shown in the aforementioned embodiment. However, configuration may be made in such a manner that only the ZMP is used as the index. In that case, the stability determining unit 60d makes determination as "stable" when the ZMP is in the normal region J and as "instable" when the ZMP is in the tipping warning region N, and outputs the result of the determination to the motion limit deciding unit 60h. In the case where configuration is made so that only the ZMP is used, the vehicle body can be prevented from floating up, so that the safety or the riding comfort can be more improved.

(5) The example in which a slow stop and a motion velocity limit are performed as motion limits for avoiding destabilization has been shown in the aforementioned embodiment. However, configuration may be made in such a manner that the slow stop is not performed but only the motion velocity limit is performed. In that case, it is not necessary to provide a slow stop model, but the sudden stop behavior predicting unit 60c may always perform behavior prediction using a sudden stop model. In addition, when the determination result of the stability determining unit 60d in the first trial is "instable", the motion limit deciding unit 60h multiplies the estimated velocity value by a motion velocity limit gain $\alpha$ (<1). In addition, the motion limit deciding unit 60h reduces the motion velocity limit gain gradually and repeats behavior prediction and stability determination till the determination result of the stability determining unit 60d turns "stable". The motion limit deciding unit 60h outputs only the motion velocity limit gain $\alpha$. When the slow stop is thus not carried out, there is no fear that the braking distance may increase due to stabilization control.

(6) The example in which the pin force sensors 43a and 44a are provided for detecting an external force applied to the bucket has been shown in the aforementioned embodiment. As another detection method, there is a method in which pressure sensors 11a and 11b may be provided in the boom cylinder. According to this method, a moment $M_l$ including an external force on the bucket and the work front's own weight is calculated from the detection values of the pressure sensors 11a and 11b provided in the boom cylinder. In addition, a moment $M_{oc}$ of the work front's own weight is calculated from the detection values of the respective angle sensors in the boom 10, the arm 12 and the bucket 23 and the respective gravity center parameters of the boom 10, the arm 12 and the bucket 23. Next, the external force on the bucket is calculated from the difference between the moments $M_l$ and $M_{oc}$ and the distance between the bucket 23 and the fulcrum 40 on which the boom is rotated. In addition, when the work machine 1 equipped with a not-shown cutter as a work tool performs only cutting work chiefly, the internal force of the cutter is used for performing the cutting work. Therefore, almost no external force is applied to the work front 6 during the work. There is therefore no fear that the stability may deteriorate due to the external force during the work. In such a case, configuration may be made in such a manner that the pin force sensors 43a and 44a for detecting the external force acting on the pins 43 and 44 (see FIG. 1) can be dispensed with.

(7) The aforementioned embodiment has been described on the assumption that the operator riding on the operator's cab 4 provided on the work machine 1 operates the work machine 1. However, there is a case where remote control using radio or the like may be performed for operating the work machine 1. During the remote control, it is difficult to accurately grasp the posture of the work machine, the inclination of a road surface, and so on in comparison with the case where the operator rides thereon. In addition, it is difficult for even a skilled operator to instinctively grasp the stability of the work machine. During the remote control, therefore, a more excellent effect can be obtained. In a remote control type work machine, configuration may be made in such a manner that a display device, a warning device, etc. are placed near the site where the operator operates the work machine, so that information about the work machine can be additionally given to the operator.

(8) The aforementioned embodiment has been described on the assumption that the control lever 50 is of an electric lever type. However, the control lever 50 may be of a hydraulic lever type. In this case, pilot pressure is measured as the quantity of operation on the lever, and the pilot pressure is corrected based on the result of the stabilization control calculation, so that stabilization can be performed.

REFERENCE SIGNS LIST

1 work machine
2 travel base 3 upperstructure
3b posture sensor (upperstructure)
3c center line
3s swing angle sensor
4 operator's cab
5 engine
6 work front
7 swing motor
8 counterweight
10 boom
11 boom cylinder
12 arm
13 arm cylinder
15 work tool cylinder
16 link (A)
17 link (B)
23 bucket
30 ground surface
40 fulcrum on which boom rotates
40a angle sensor (fulcrum on which boom rotates)
41 fulcrum on which arm rotates
41a angle sensor (fulcrum on which arm rotates)
42 fulcrum on which bucket rotates
42a angle sensor (fulcrum on which bucket rotates)
43 pin (bucket-to-arm)
43a external force sensor (pin 43)
44 pin (bucket-to-link)
44a external force sensor (pin 44)
50 control lever
51s swing lever operation quantity sensor
51b boom lever operation quantity sensor
51a arm lever operation quantity sensor
51c bucket lever operation quantity sensor
55 user setting input unit
60 control device
60a stabilization control calculation unit
60b velocity estimating unit
60c sudden stop behavior predicting unit
60d stability determining unit
60e link calculation unit
60f ZMP calculation/evaluation unit
60g mechanical energy calculation/evaluation unit
60h motion limit deciding unit
60i command value generating unit
60x input unit
60y output unit
60z calculation unit
61 display device
63 warning device
70 ZMP

The invention claimed is:

1. A work machine comprising a travel base, a work machine body attached on the travel base, a work front attached to the work machine body swingably in an up/down direction, and a control device for controlling drive of each of these portions, wherein: the control device includes:

a stabilization control calculation unit which, if the control lever in an operating state is assumed to be brought back to a stop command position, predicts a change in stability until each movable portion in the travel base, the work machine body and the work front stops in accordance with a quantity of operation on a control lever for operating the drive of the movable portion and calculates a motion limit needed to keep the work machine stable until the movable portion stops; and a command value generating unit which corrects command information to an actuator driving the movable portion, based on a result of the calculation of the stabilization control calculation unit.

2. A work machine according to claim 1, wherein:
the stabilization control calculation unit calculates, as the motion limit, at least one of a slow stop command value for limiting deceleration of the movable portion to stop the movable portion slowly and a motion velocity upper limit for limiting a motion velocity of the actuator.

3. A work machine according to claim 1, wherein:
the stabilization control calculation unit calculates the motion limit using at least one of ZMP coordinates calculated from position information, acceleration information and external force information as to each movable portion in the travel base, the work machine body and the work front, and mechanical energy calculated from position information and velocity information as to each movable portion of the work machine.

4. A work machine according to claim 2, wherein:
the stabilization control calculation unit stores a limit of deceleration of the movable portion in advance, and corrects the command information to the actuator so as to satisfy the limit of the deceleration.

5. A work machine according to claim 1, wherein:
the control device includes a behavior predicting unit which predicts behavior of the work machine in the case where the control lever in the operating state is instantaneously brought back to the stop command position; and the behavior predicting unit uses, as a model, a cubic function whose extreme values correspond to a velocity change start point expressed by a time instant when velocity starts to change and the velocity at that time instant, and a peak arrival point expressed by a time instant when an amount of change in velocity is the highest since release of the control lever and the velocity at that time instant, and uses an overshoot rate calculated based on the rate between the velocity change start point and the peak arrival point identified in advance for each motion of the travel base, the work machine body and the work front, a period of time between the release of the control lever and the velocity change start point, and a period of time between the velocity change start point and the peak arrival point.

6. A work machine according to claim 2, wherein:
the stabilization control calculation unit calculates the motion limit using at least one of ZMP coordinates calculated from position information, acceleration information and external force information as to each movable portion in the travel base, the work machine body and the work front, and mechanical energy calculated from position information and velocity information as to each movable portion of the work machine.

* * * * *